(12) United States Patent
Ishihara

(10) Patent No.: US 9,966,241 B2
(45) Date of Patent: May 8, 2018

(54) SPUTTERING APPARATUS

(71) Applicant: CANON ANELVA CORPORATION, Kawasaki-shi, Kanagawa-ken (JP)

(72) Inventor: Shigenori Ishihara, Tokyo (JP)

(73) Assignee: CANON ANELVA CORPORATION, Kawasaki-Shi, Kanagawa-Ken (JP)

( * ) Notice: Subject to any disclaimer, the term of this patent is extended or adjusted under 35 U.S.C. 154(b) by 0 days. days.

(21) Appl. No.: 14/878,567

(22) Filed: Oct. 8, 2015

(65) Prior Publication Data
US 2016/0027623 A1 Jan. 28, 2016

Related U.S. Application Data

(63) Continuation of application No. PCT/JP2013/007530, filed on Dec. 24, 2013.

(30) Foreign Application Priority Data

Apr. 10, 2013 (JP) .................. 2013-082484

(51) Int. Cl.
*H01J 37/34* (2006.01)
*C23C 14/34* (2006.01)
(Continued)

(52) U.S. Cl.
CPC ...... *H01J 37/3441* (2013.01); *C23C 14/3464* (2013.01); *C23C 14/352* (2013.01);
(Continued)

(58) Field of Classification Search
CPC .............. H01J 37/3441; H01J 37/3447; H01J 37/3414; H01J 37/3417; C23C 14/3464; C23C 14/352; C23C 14/564
See application file for complete search history.

(56) References Cited

U.S. PATENT DOCUMENTS 6,217,730 B1 4/2001 Nakajima et al.
8,663,437 B2 3/2014 Yamaguchi et al.
(Continued)

FOREIGN PATENT DOCUMENTS

JP 4-325671 A 11/1992
JP 5-255847 A 10/1993
(Continued)

OTHER PUBLICATIONS

Notice of Allowance dated Sep. 24, 2015, by the Taiwanese Patent Office in corresponding Taiwanese Patent Application No. 103113003. (3 pages).
(Continued)

*Primary Examiner* — Michael A Band
(74) *Attorney, Agent, or Firm* — Buchanan Ingersoll & Rooney PC

(57) ABSTRACT

A sputtering apparatus includes a shutter arranged having a first surface on a side of a substrate holder and a second surface on the opposite side, a first shield having a third surface including a portion facing the second surface and a fourth surface on the opposite side, a second shield having a fifth surface including a portion facing end portions of the shutter and the first shield, and a gas supply unit supplying a gas into a space arranged outside the first shield to communicate with a first gap between the second surface of the shutter and the third surface of the first shield. The second shield includes a protruding portion on the fifth surface to form a second gap between the protruding portion and the end portion of the shutter.

17 Claims, 6 Drawing Sheets

(51) Int. Cl.
    *C23C 14/56* (2006.01)
    *C23C 14/35* (2006.01)
(52) U.S. Cl.
    CPC ........ *C23C 14/564* (2013.01); *H01J 37/3417* (2013.01); *H01J 37/3435* (2013.01); *H01J 37/3447* (2013.01); *C23C 14/34* (2013.01)

(56) References Cited

U.S. PATENT DOCUMENTS

| | | | |
|---|---|---|---|
| 8,992,743 | B2 | 3/2015 | Yamaguchi et al. |
| 2012/0031748 | A1* | 2/2012 | Ishihara .............. C23C 14/0042 204/192.13 |
| 2012/0152736 | A1 | 6/2012 | Yamaguchi et al. |
| 2012/0234672 | A1* | 9/2012 | Yamaguchi ......... C23C 14/0063 204/192.12 |
| 2014/0054164 | A1 | 2/2014 | Yamaguchi et al. |

FOREIGN PATENT DOCUMENTS

| | | |
|---|---|---|
| JP | 8-269705 A | 10/1996 |
| JP | 2002302763 A * | 10/2002 ............. C23C 14/34 |
| JP | 2005-187830 A | 7/2005 |
| JP | 2009-057608 A | 3/2009 |
| JP | 4598161 B2 | 12/2010 |
| JP | 2012-52221 A | 3/2012 |
| JP | 2012-132064 A | 7/2012 |
| TW | 524869 B | 3/2003 |
| WO | 2011077653 A1 | 6/2011 |
| WO | WO 2011117945 A1 * | 9/2011 ............. C23C 14/34 |
| WO | 2012033198 A1 | 3/2012 |

OTHER PUBLICATIONS

International Search Report (PCT/ISA/210) dated Mar. 18, 2014, by the Japanese Patent Office as the International Searching Authority for International Application No. PCT/JP2013/007530.

Written Opinion (PCT/ISA/237) dated Mar. 18, 2014, by the Japanese Patent Office as the International Searching Authority for International Application No. PCT/JP2013/007530.

Office Action (Notice of Allowance) dated Nov. 9, 2016, by the Korean Patent Office in corresponding Korean Patent Application No. 10-2015-7031183, and translation. (3 pages).

\* cited by examiner

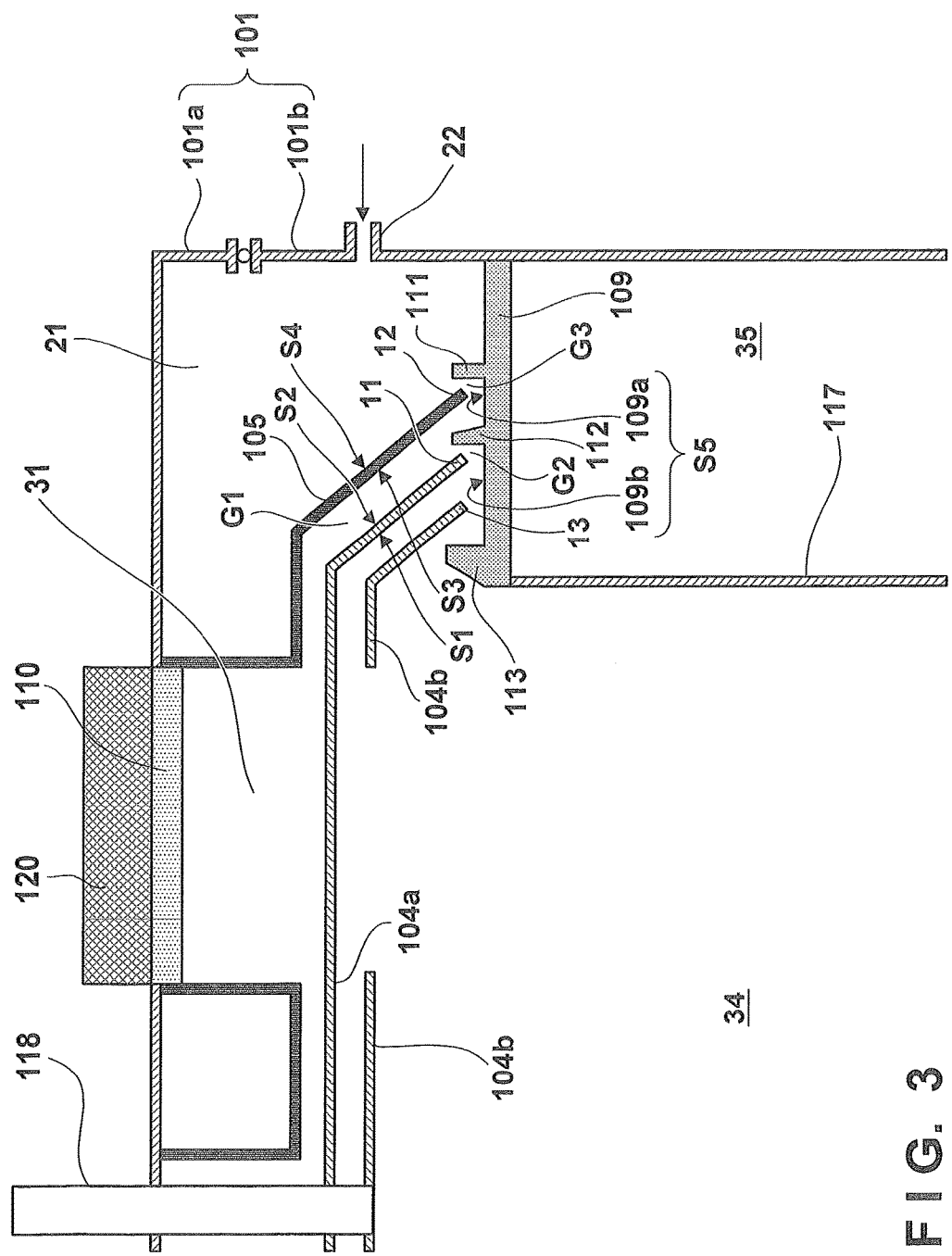
F I G. 3

SPUTTERING APPARATUS

This application is a continuation of International Patent Application No. PCT/JP2013/007530 filed on Dec. 24, 2013, and claims priority to Japanese Patent Application No. 2013-082484 filed on Apr. 10, 2013, the entire content of both of which is incorporated herein by reference.

FIELD OF THE INVENTION

The present invention relates to a sputtering apparatus.

DESCRIPTION OF THE RELATED ART

Japanese Patent Laid-Open No. 2005-187830 discloses a sputtering apparatus including a substrate holder which holds a substrate, a sputter cathode on which a target is mounted, a shutter plate movably arranged between the target and the substrate, a vacuum chamber containing them, and a gas inlet for supplying a gas such as argon gas into the vacuum vessel.

At the time of ignition for generating a plasma, it is necessary to increase the pressure in a space facing a target to a proper pressure. After the ignition, the pressure in the space in a vacuum chamber is reduced to a proper pressure for sputtering. The sputtering apparatus disclosed in Japanese Patent Laid-Open No. 2005-187830 does not have an arrangement for selectively increasing the pressure in a space facing a target. It is therefore necessary to increase the overall pressure in the space in the vacuum chamber for ignition.

SUMMARY OF INVENTION

The present invention provides a sputtering apparatus having an arrangement advantageous for ignition.

One aspect of the present invention relates to a sputtering apparatus including a chamber, a substrate holder configured to hold a substrate in the chamber, and a target holder configured to hold a target. The sputtering apparatus includes a shutter arranged between the substrate holder and the target holder and having a first surface on a side of the substrate holder and a second surface on an opposite side to the first surface, a first shield having a third surface including a portion facing the second surface of the shutter and a fourth surface on an opposite side to the third surface, a second shield having a fifth surface including a portion facing an end portion of the shutter and an end portion of the first shield, and a gas supply unit configured to supply a gas into a gas diffusion space arranged outside the first shield so as to communicate with a first gap formed between the second surface of the shutter and the third surface of the first shield. The second shield includes a protruding portion protruding from the fifth surface so as to form a second gap between the protruding portion and the end portion of the shutter. A gas supplied into the gas diffusion space by the gas supply unit is capable of moving through the first gap toward a space near the target.

BRIEF DESCRIPTION OF DRAWINGS

FIG. 3 is an enlarged view of part of the sectional view of the sputtering apparatus shown in FIG. 1;

DESCRIPTION OF EMBODIMENTS

An embodiment of the present invention will be described below with reference to the accompanying drawings.

Figure 1:
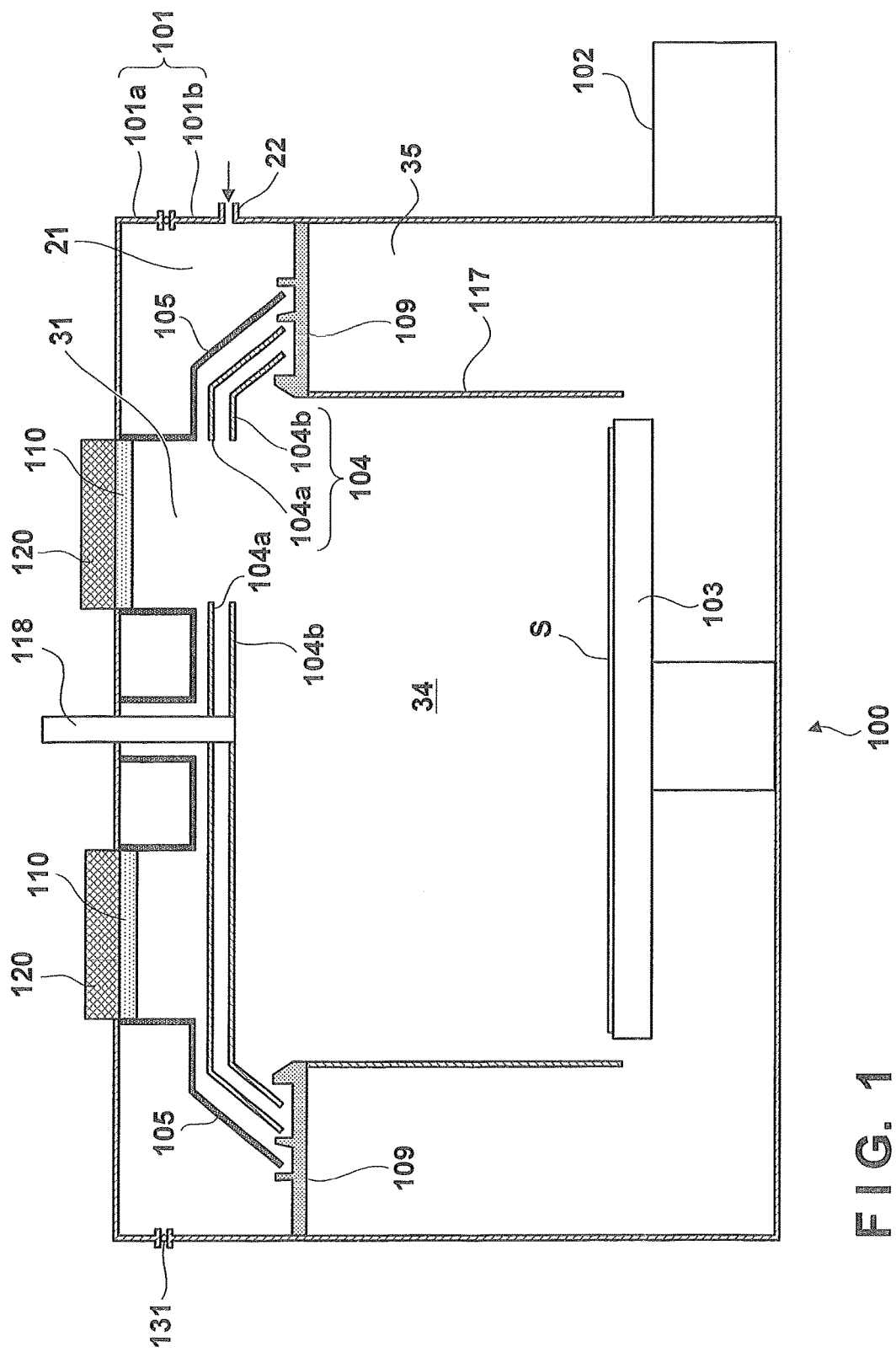
FIG. 1 is a sectional view showing the schematic arrangement of a sputtering apparatus according to one embodiment of the present invention.
Figure 2:
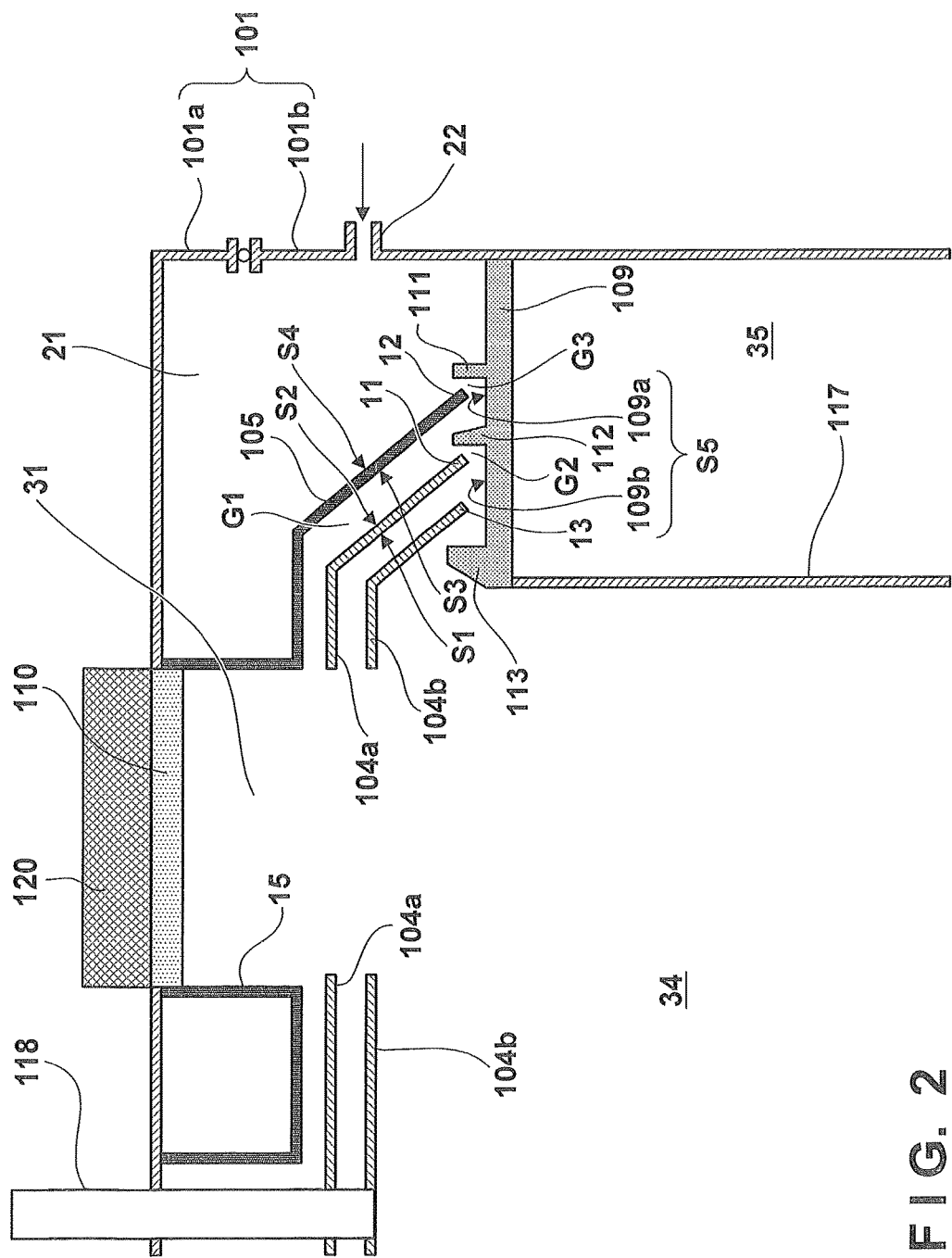
FIG. 2 is an enlarged view of part of the sectional view of the sputtering apparatus shown in FIG. 1.

FIG. 1 is a view showing the schematic arrangement of a sputtering apparatus 100 according to one embodiment of the present invention. FIG. 2 is an enlarged view of part of the sputtering apparatus 100. The sputtering apparatus 100 includes a chamber 101, a substrate holder 103 for holding a substrate S in the chamber 101, and one or a plurality of target holders 120 for holding one or a plurality of targets 110. The chamber 101 includes, for example, an upper chamber 101a and a lower chamber 101b, and can be divided into the upper chamber 101a and the lower chamber 101b. The upper chamber 101a and the lower chamber 101b can be coupled with a hinge (not shown). At the time of maintenance, the chamber 101 can be divided into the upper chamber 101a and the lower chamber 101b. A seal member 131 such as an O-ring can be arranged between the upper chamber 101a and the lower chamber 101b. A power source apparatus (not shown) supplies power to the targets 110 via the target holders 120.

The sputtering apparatus 100 can include a shutter unit 104, a first shield 105, a second shield 109, a gas supply unit 22, and an exhaust apparatus 102. The shutter unit 104 can include one or a plurality of shutters. According to the embodiment shown in FIG. 1, the shutter unit 104 includes a first shutter 104a and a second shutter 104b. A rotating mechanism 118 independently rotates the first shutter 104a and the second shutter 104b. The first shutter 104a and the second shutter 104b each have at least one opening. The rotating mechanism 118 drives the first shutter 104a and the second shutter 104b to make the targets 110 used for sputtering face an internal space (the space which the substrate S faces) 34 in the chamber 101 through the opening of the first shutter 104a and the opening of the second shutter 104b. The first shutter 104a is arranged between the substrate holder 103 and the target holders 120, and has a first surface S1 on the substrate holder 103 side and a second surface S2 on the opposite side to the first surface S1. The second shutter 104b has a surface facing the first surface S1.

The first shield 105 has a third surface S3 including a portion facing the second surface S2 of the first shutter 104a and a fourth surface S4 on the opposite side to the third surface S3. The first shield 105 can include portions 15 which are arranged to surround the targets 110. Each portion 15 can be a tubular portion surrounding the target 110 and a space 31 near the target 110. The second shield 109 has a fifth surface S5 including portions 109a and 109b respectively facing an end portion 11 of the first shutter 104a and an end portion 12 of the first shield 105. The second shield 109 can have a ring-like shape.

A first gap G1 is formed between the second surface S2 of the first shutter 104a and the third surface S3 of the first shield 105. A gas diffusion space 21 is arranged outside the first shield 105 so as to communicate with the first gap G1. The gas diffusion space 21 can be, for example, an annular space. The gas supply unit 22 supplies a gas to the gas diffusion space 21. The gas diffusion space 21 can be at least partly defined by the fourth surface S4 of the first shield 105 and the fifth surface S5 of the second shield 109.

The second shield 109 includes a protruding portion 112. The protruding portion 112 protrudes from the fifth surface S5 to form a second gap G2 between the end portion 11 of the first shutter 104a and the protruding portion 112. The protruding portion 112 prevents sputtering particles from the internal space 34 between the targets 110 and the substrate S and/or the spaces 31 near the targets 110 from entering the gas diffusion space 21 after passing through between the end portion 11 of the first shutter 104a and the second shield 109. The gas, for example, Ar, Kr, or Xe gas, supplied into the gas diffusion space 21 by the gas supply unit 22 can move through the first gap G1 toward the spaces 31 near the targets 110.

The sputtering apparatus 100 can include a third shield 117 arranged to surround the internal space 34 between the shutter unit 104 and the substrate holder 103. The third shield 117 is arranged to form an external space 35 between the third shield 117 and the chamber 101. The second shield 109 can be arranged to separate the gas diffusion space 21 from the external space 35. The gas flowing from the gas diffusion space 21 into the spaces 31 near the targets 110 through the first gap G1 can pass through the internal space 34 surrounded by the third shield 117 between the shutter unit 104 and the substrate holder 103, and can be sucked by the exhaust apparatus 102 through an exhaust outlet which can be provided at a position lower than the substrate holding surface of the substrate holder 103. This arrangement can form a pressure distribution in the chamber 101 such that the pressure in the space 31 near each target 110 becomes higher than that in the internal space 34. This makes it possible to quickly shift to a state allowing ignition for the generation of a plasma after the supply of a gas from the gas supply unit 22.

As exemplarily shown in FIG. 3, it is preferable to perform ignition for the generation of a plasma by controlling the shutter unit 104 so as to avoid the targets 110 used for sputtering from facing the internal space 34. That is, it is preferable to perform ignition for the generation of a plasma while the spaces 31 near the targets 110 used for sputtering are separated from the internal space 34 on the substrate S side by the shutter unit 104 (the first shutter 104a and/or the second shutter 104b). Such a state is effective in making the pressure in the space 31 near each target 110 sufficiently higher than the pressure in the internal space 34 on the substrate S side.

The second gap G2 is preferably smaller than the minimum distance between the first shield 105 and the second shield 109. This contributes to a reduction in the conductance of a path extending from the gas diffusion space 21 to the internal space 34 through the second gap G2 and the facilitation of the supply of a gas from the gas diffusion space 21 into the space 31 near each target 110 through the first gap G1.

The second shield 109 preferably further includes an outside convex portion 111 on the fifth surface S5. In this case, the outside convex portion 111 is arranged so as to make the end portion 12 of the first shield 105 face the portion 109a between the protruding portion 112 and the outside convex portion 111 of the fifth surface S5. The outside convex portion 111 prevents sputtering particles from the internal space 34 between the targets 110 and the substrate S and/or the spaces 31 near the targets 110 from entering the gas diffusion space 21.

A third gap G3 is formed by the outside convex portion 111 and the end portion 12 of the first shield 105. The third gap G3 is preferably smaller than the shortest distance between the first shield 105 and the portion 109a between the protruding portion 112 and the outside convex portion 111 of the second shield 109. This contributes to making the pressure in the gas diffusion space 21 constant and providing the same pressure to the space 31 near each of the plurality of targets 110. This is advantageous in reducing variations in pressure state between the plurality of targets 110.

The second shield 109 preferably further includes an inside convex portion 113 on the fifth surface S5. The inside convex portion 113 can be arranged such that the end portion 11 of the first shutter 104a (an end portion 13 of the second shutter 104b) faces the portion 109b between the protruding portion 112 and the inside convex portion 113 of the fifth surface S5. The inside convex portion 113 prevents sputtering particles from the internal space 34 between the target 110 and the substrate S and/or the space 31 near each target 110 from entering the gas diffusion space 21.

The protruding portion 112, the outside convex portion 111, the inside convex portion 113, the first shutter 104a, the second shutter 104b, and the first shield 105 make paths directly extending from the gas diffusion space 21 to the spaces 31 and 34 meander, thereby increasing the conductance of each path and preventing sputtering particles from entering the gas diffusion space 21.

Figure 4:
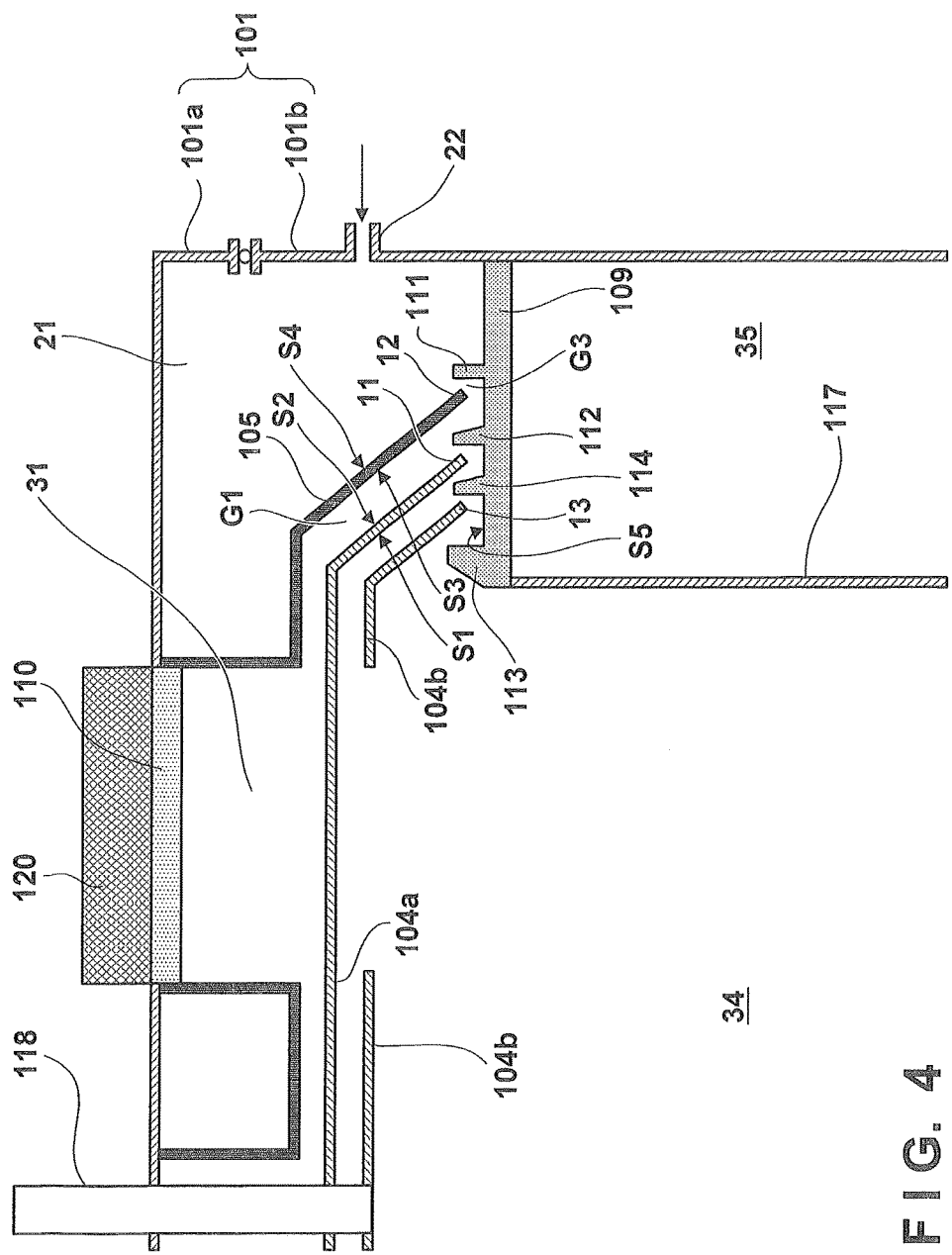
FIG. 4 is a view showing a modification of the sputtering apparatus shown in FIGS. 1 to 3.

As exemplarily shown in FIG. 4, the second shield 109 may have a protruding portion 114 protruding toward the space between the end portion 11 of the first shutter 104a and the end portion 13 of the second shutter 104b. The addition of the protruding portion 114 is also advantageous in increasing the conductances of the paths directly extending from the gas diffusion space 21 to the spaces 31 and 34. The addition of the protruding portion 114 is also advantageous in improving the effect of preventing sputtering particles from entering the gas diffusion space 21.

Figure 5:
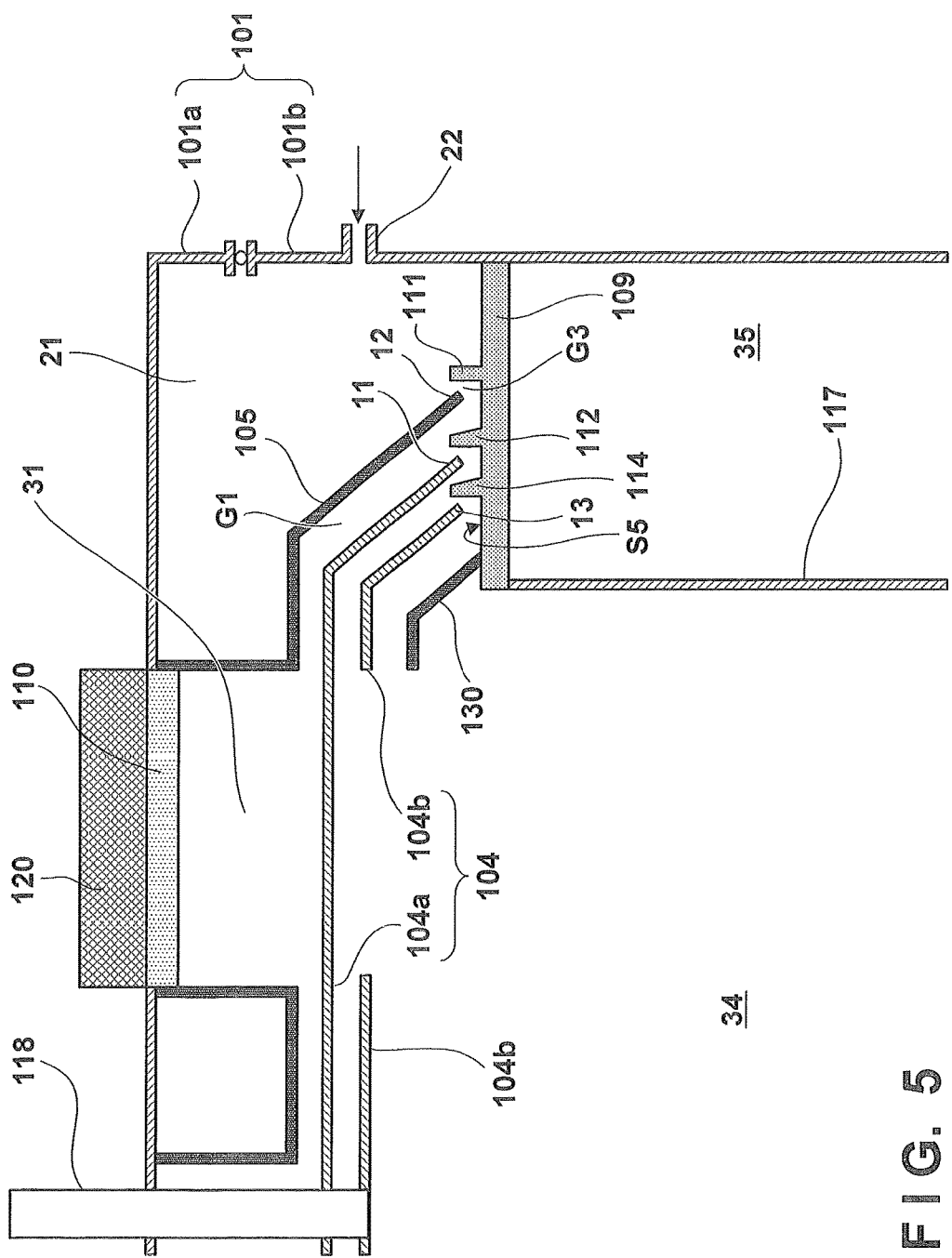
FIG. 5 is a view showing a modification of the sputtering apparatus shown in FIGS. 1 to 3.

As exemplarily shown in FIG. 5, an additional shield 130 may be provided between the shutter unit 104 and the internal space 34. The additional shield 130 can be coupled to the second shield 109. The additional shield 130 increases the conductances of the paths extending from the gas diffusion space 21 to the spaces 31 and 34 without passing through the first gap G1.

Figure 6:
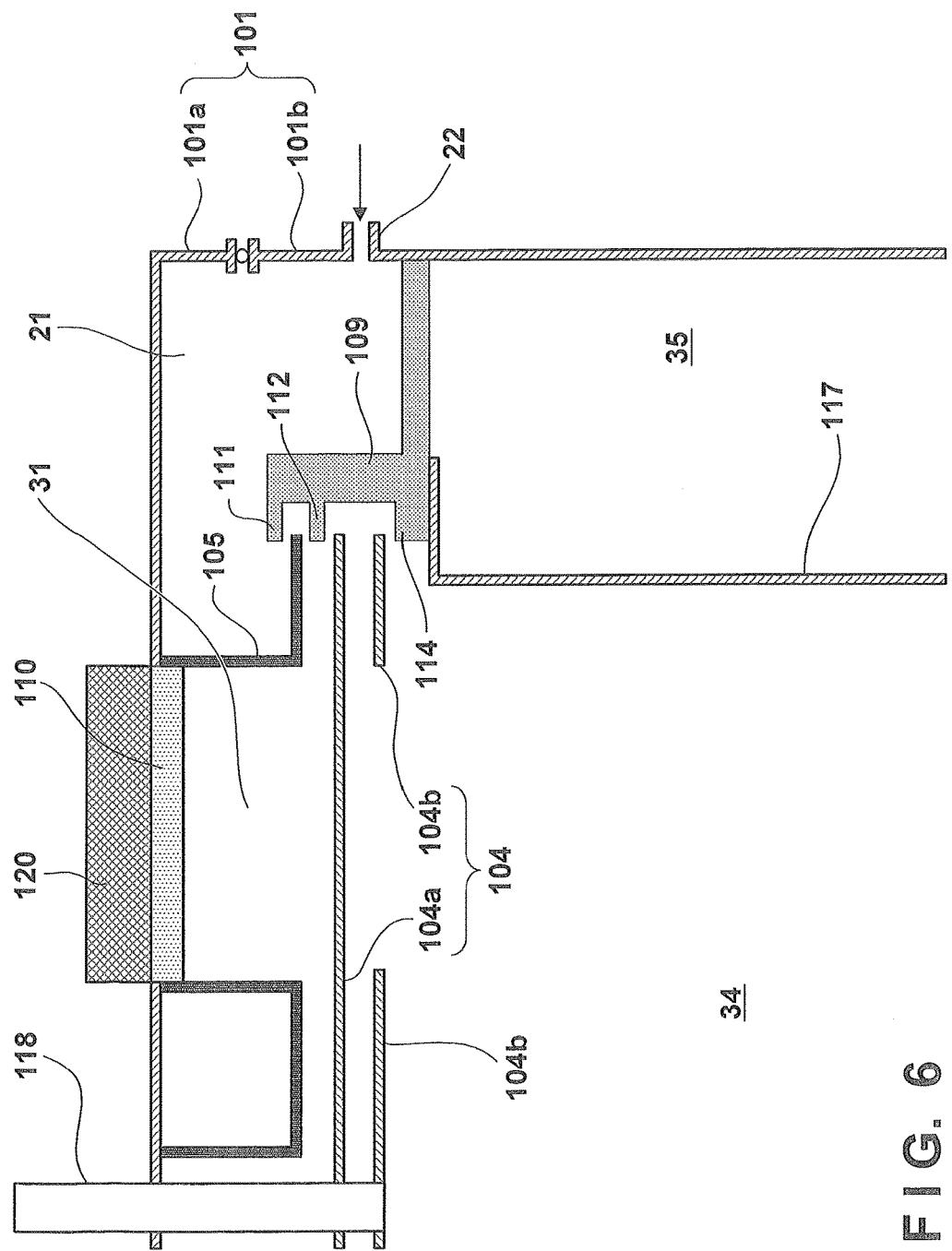
FIG. 6 is a view showing a modification of the sputtering apparatus shown in FIGS. 1 to 3.

The shutters exemplified as the first shutter 104a and the second shutter 104b may be curved as exemplarily shown in FIGS. 1 to 5 or may be formed into planar shapes as exemplarily shown in FIG. 6. The structure of the second shield 109 can be changed in accordance with the shape of each shutter.

The present invention is not limited to the above embodiment and various changes and modifications can be made within the spirit and scope of the present invention. Therefore, to apprise the public of the scope of the present invention, the following claims are made.

The invention claimed is:

1. A sputtering apparatus including a chamber, a substrate holder configured to hold a substrate in the chamber, and a target holder configured to hold a target, the sputtering apparatus comprising:
   a shutter arranged between the substrate holder and the target holder and having a first surface on a side of the substrate holder, a second surface on an opposite side to the first surface, and an opening;
   a first shield having a third surface including a portion facing the second surface of the shutter and a fourth surface on an opposite side to the third surface;

a second shield having a fifth surface including a portion facing an end portion of the shutter and an end portion of the first shield;

a gas supply unit configured to supply a gas directly into a gas diffusion space, wherein the gas diffusion space has an annular shape and the gas diffusion space is arranged outside the first shield, wherein the gas diffusion space is at least partly defined by the fourth surface of the first shield and the fifth surface of the second shield such that the gas diffusion space is spaced apart from the shutter by at least the first shield, and wherein the gas diffusion space communicates with a first gap formed between the second surface of the shutter and the third surface of the first shield, wherein a contour of the shutter follows a contour of the first shield at least adjacent to the gas diffusion space;

a shutter rotating mechanism configured to rotate the shutter such that the target to be used for sputtering faces the substrate through the opening, wherein the shutter rotating mechanism rotates the shutter about an axis which is arranged at a center of the annular shape;

wherein the second shield includes a protruding portion protruding from the fifth surface and a portion of the protruding portion extends into the first gap between the shutter and the first shield so as to form a second gap between the protruding portion and the end portion of the shutter, wherein the first gap is larger than the second gap, and a gas supplied into the gas diffusion space by the gas supply unit is capable of moving through the first gap toward a space near the target.

2. The sputtering apparatus according to claim 1, wherein the second gap is smaller than a minimum distance between the first shield and the second shield.

3. The sputtering apparatus according to claim 1, wherein the second shield further includes an outside convex portion on the fifth surface, and the outside convex portion is arranged such that the end portion of the first shield faces a portion of the second shield between the protruding portion and the outside convex portion of the fifth surface.

4. The sputtering apparatus according to claim 3, wherein a third gap is formed by the outside convex portion of the second shield and the end portion of the first shield, and the third gap is smaller than a shortest distance between the first shield and the portion of the second shield between the protruding portion and the outside convex portion of the second shield.

5. The sputtering apparatus according to claim 1, wherein the second shield further includes an inside convex portion on the fifth surface, and the inside convex portion is arranged such that the end portion of the shutter faces a portion of the second shield between the protruding portion and the inside convex portion of the fifth surface.

6. The sputtering apparatus according to claim 5, further comprising a second shutter having a surface facing the first surface of the shutter, wherein the inside convex portion is arranged such that an end portion of the second shutter faces the portion of the second shield between the protruding portion and the inside convex portion of the fifth surface.

7. The sputtering apparatus according to claim 1, wherein the first shield includes a portion arranged to surround the target.

8. The sputtering apparatus according to claim 1, further comprising at least one target holder in addition to the target holder.

9. The sputtering apparatus according to claim 1, wherein the first shield and the second shield are arranged in the chamber, and at least a part of the gas diffusion space is defined by the fourth surface of the first shield, the fifth surface of the second shield and an inner surface of the chamber.

10. The sputtering apparatus according to claim 9, wherein the gas diffusion space is an annular space.

11. The sputtering apparatus according to claim 1, wherein the gas supplied into the gas diffusion space by the gas supply unit is capable of passing through a gap between the first shield and the second shield, and entering and passing through the first gap toward the space near the target.

12. The sputtering apparatus according to claim 1, wherein the gas diffusion space is separated from the shutter by a separating space which is formed between the second surface of the shutter and the third surface of the first shield, and which separating space includes the first gap.

13. The sputtering apparatus according to claim 1, further comprising a second shutter having a surface facing the first surface of the shutter, wherein the fifth surface of the second shield includes a portion facing an end portion of the second shutter.

14. The sputtering apparatus according to claim 1, further comprising a second shutter having a surface facing the first surface of the shutter, wherein a contour of the second shutter follows the contour of the first shield.

15. The sputtering apparatus according to claim 1, further comprising a second shutter having a surface facing the first surface of the shutter, wherein the shutter and the second shutter are rotated around a same axis.

16. A sputtering apparatus including a chamber, a substrate holder configured to hold a substrate in the chamber, and a target holder configured to hold a target, the sputtering apparatus comprising:

a shutter arranged between the substrate holder and the target holder and having a first surface on a side of the substrate holder, a second surface on an opposite side to the first surface, and an opening;

a first shield having a third surface including a portion facing the second surface of the shutter and a fourth surface on an opposite side to the third surface;

a second shield having a fifth surface including a portion facing an end portion of the shutter and an end portion of the first shield;

a gas supply unit configured to supply a gas directly into a gas diffusion space, wherein the gas diffusion space has an annular shape and the gas diffusion space is arranged outside the first shield, wherein the gas diffusion space is at least partly defined by the fourth surface of the first shield and the fifth surface of the second shield such that the gas diffusion space is spaced apart from the shutter by at least the first shield, and wherein the gas diffusion space communicates with a first gap formed between the second surface of the shutter and the third surface of the first shield, wherein a contour of the shutter follows a contour of the first shield at least adjacent to the gas diffusion space;

a shutter rotating mechanism configured to rotate the shutter such that the target to be used for sputtering faces the substrate through the opening, wherein the shutter rotating mechanism rotates the shutter about an axis which is arranged at a center of the annular shape;

wherein the second shield includes first, second, and third protruding portions protruding from the fifth surface, wherein the end portion of the shutter extends between the first and second protruding portions to form a second gap and the end portion of the first shield extends between the second and third protrusions, and a gas supplied into the gas diffusion space by the gas supply unit is capable of moving through the first gap toward a space near the target, wherein the first gap is larger than the second gap.

17. The sputtering apparatus according to claim 1, further comprising a second protrusion extending from the fifth surface of the second shield between the protruding portion and an end of the second shield.

* * * * *